United States Patent
Satoh

(10) Patent No.: US 12,490,540 B2
(45) Date of Patent: Dec. 2, 2025

(54) OPTICAL SEMICONDUCTOR ARRAY

(71) Applicant: Kyoto Semiconductor Co., Ltd., Kyoto (JP)

(72) Inventor: Takehito Satoh, Kyoto (JP)

(73) Assignee: Dexerials Corporation, Tochigi (JP)

( * ) Notice: Subject to any disclaimer, the term of this patent is extended or adjusted under 35 U.S.C. 154(b) by 531 days.

(21) Appl. No.: 17/283,901

(22) PCT Filed: Jun. 24, 2020

(86) PCT No.: PCT/JP2020/024809
§ 371 (c)(1),
(2) Date: Mar. 9, 2023

(87) PCT Pub. No.: WO2021/260841
PCT Pub. Date: Dec. 30, 2021

(65) Prior Publication Data
US 2023/0215895 A1  Jul. 6, 2023

(51) Int. Cl.
H10F 39/00  (2025.01)
H10F 30/20  (2025.01)

(52) U.S. Cl.
CPC ........... *H10F 39/811* (2025.01); *H10F 30/20* (2025.01); *H10F 39/024* (2025.01)

(58) Field of Classification Search
CPC ....... H10F 30/20; H10F 39/024; H10F 39/811
See application file for complete search history.

(56) References Cited

U.S. PATENT DOCUMENTS

| | | | |
|---|---|---|---|
| 9,257,577 B1 * | 2/2016 | Kikuchi | H10F 77/306 |
| 10,522,582 B2 * | 12/2019 | Maruyama | H10F 39/021 |
| 10,811,456 B2 * | 10/2020 | Maruyama | G01J 5/20 |
| 2016/0020339 A1 * | 1/2016 | Kikuchi | H10F 30/222 |
| | | | 257/435 |
| 2018/0261641 A1 * | 9/2018 | Maruyama | G01J 5/24 |
| 2019/0206921 A1 * | 7/2019 | Maruyama | G01J 5/045 |
| 2023/0215895 A1 * | 7/2023 | Satoh | H10F 30/20 |
| | | | 257/443 |

FOREIGN PATENT DOCUMENTS

| | | |
|---|---|---|
| JP | H02-037746 A | 2/1990 |
| JP | 5426160 B2 | 12/2013 |
| JP | 2014-131041 A | 7/2014 |
| JP | 2014-138096 A | 7/2014 |
| JP | 2014-165224 A | 9/2014 |
| JP | 2016-025095 A | 2/2016 |
| JP | 2018-152486 A | 9/2018 |

* cited by examiner

*Primary Examiner* — Jeff W Natalini
*Assistant Examiner* — Alexander Belousov
(74) *Attorney, Agent, or Firm* — Norris McLaughlin, P.A.

(57) ABSTRACT

In an optical semiconductor array (1A) having a semiconductor substrate (10) and a plurality of mesa-shaped optical semiconductor elements (11a to 11d) separated by grooves (12a, 12b) on the semiconductor substrate (10), each of the plurality of optical semiconductor elements (11a to 11d) comprises a semiconductor laminated part (20) including a first semiconductor layer (20a) in contact with the semiconductor substrate (10), and a connecting hole (21a) formed at a portion separated from the groove (12a, 12b) in the semiconductor laminated part (20) so as to extend from a surface of the semiconductor laminated part (20) to the first semiconductor layer (20a).

1 Claim, 5 Drawing Sheets

OPTICAL SEMICONDUCTOR ARRAY

TECHNICAL FIELD

The present invention relates to an optical semiconductor array in which a plurality of light receiving elements or light emitting elements are integrally formed in an array, and relates to manufacturing method thereof.

BACKGROUND ART

There are many cases of using an optical semiconductor array configured by electrically connecting a plurality of optical semiconductor elements arranged in an array in series or in parallel in order to drive an optical semiconductor element such as a photodiode, a light emitting diode, or a laser diode with a high voltage drive or an AC drive. The optical semiconductor array can be miniaturized by integrally forming a plurality of optical semiconductor elements, and the output can be improved by suppressing the variation in the characteristics of each element.

Generally, a diode structure is formed by forming a plurality of semiconductor layers on a semi-insulating or insulating semiconductor substrate such as a GaAs substrate, an InP substrate, a sapphire substrate, or a Si substrate. Then, by mesa etching, for example, as in Patent Documents #1 to #4, by forming grooves in a plurality of semiconductor layers, the elements are separated into a plurality of mesa-shaped optical semiconductor elements.

Among these plurality of optical semiconductor elements, a plurality of optical semiconductor elements are electrically connected in series by a wiring that connects different conductive semiconductor layers between adjacent optical semiconductor elements. Further, a group in which a plurality of optical semiconductor elements are connected in series may be electrically connected in parallel.

PRIOR ART DOCUMENTS

Patent Documents

Patent Document #1: Japanese Laid-open Publication 2014-131041.
Patent Document #2: Japanese Laid-open Publication 2014-138096.
Patent Document #3: Japanese Laid-open Publication 2018-152486.
Patent Document #4: Japanese Patent Publication 5426160.

SUMMARY OF THE INVENTION

Problems to be Solved by the Invention

By the way, when the optical semiconductor elements connected in series are photodiodes, the output current when the entire optical semiconductor array is irradiated with light is proportional to the area of the optical semiconductor element to be photoelectrically converted. Therefore, in order to increase the area (effective area) of the optical semiconductor element in the light receiving region of the optical semiconductor array irradiated with light, it is required to reduce the area occupied by the groove. Further, there is also a demand for expanding the effective area of the light emitting element.

However, in Patent Documents #1, #2 and #4, in order to connect the wiring to the semiconductor layer on the semiconductor substrate side, the groove is formed with a large width to some extent, and the area of the semiconductor layer on the surface side is smaller than that of the semiconductor layer on the semiconductor substrate side. Similarly, in Patent Document #3, the semiconductor layer on the surface side is formed in an area smaller than that of the semiconductor layer on the base material side.

Therefore, in the conventional optical semiconductor array having a mesa-shaped optical semiconductor element, the area of the optical semiconductor element is reduced due to the wide groove, and the effective area of the optical semiconductor array is reduced. If the width of the groove is reduced in order to increase the effective area, the allowable range of misalignment becomes smaller, which makes it difficult to manufacture the optical semiconductor array and raises the manufacturing cost.

The present invention has been made in view of the above problems, and an object of the present invention is to provide an optical semiconductor array having a large effective.

Means to Solve the Problems

The present invention presents an optical semiconductor array having a semiconductor substrate and a plurality of mesa-shaped optical semiconductor elements separated by grooves on the semiconductor substrate, wherein each of the plurality of optical semiconductor elements comprises a semiconductor laminated part including a first semiconductor layer in contact with the semiconductor substrate, a connecting hole formed at a portion separated from the groove in the semiconductor laminated part so as to extend from a surface of the semiconductor laminated part to the first semiconductor layer, and a protective film having an insulating property covering the surface of the semiconductor laminated part and a cylindrical inner wall of the connecting hole; wherein there are provided with an embedded protective film embedded in a whole of the groove so as to continue from the protective film, and a wiring for connecting, through the connecting hole of one of the adjacent optical semiconductor elements and a wiring connection portion formed through the protective film so as to expose a portion of the surface of the semiconductor laminated part of the other of the adjacent optical semiconductor elements, the first semiconductor layer of the one optical semiconductor element and a surface of the semiconductor laminated part of the other optical semiconductor element; wherein a portion of the wiring is formed on a surface of the embedded protective film at a position passing the groove.

According to the above configuration, since the plurality of optical semiconductor elements of the optical semiconductor array each have a connecting hole for connecting to the first semiconductor layer, they are not connected to the first semiconductor layer via grooves. Moreover, there is provided with an embedded protective film embedded in a whole of the groove so as to continue from the protective film, and a portion of the wiring is formed on a surface of the embedded protective film at a position passing the groove. Therefore, the width of the groove can be reduced remarkably, and the size of the semiconductor layer above the first semiconductor layer of each optical semiconductor element can be made equal to that of the first semiconductor layer. Therefore, the area of each of the plurality of optical semiconductor elements in the optical semiconductor array can be increased to increase the effective area of the optical semiconductor element array. Further, since the connecting hole is separated from the groove, the area of the connecting hole is the same among the plurality of optical semiconductor elements. Therefore, it is possible to reduce the variation in the area of the plurality of optical semiconductor elements due to the connecting holes, which is advantageous in reducing the output variation of the plurality of optical semiconductor elements in the optical semiconductor array.

And, in order to electrically connect the plurality of optical semiconductor elements, provided is a wiring for connecting, through the connecting hole of one of the adjacent optical semiconductor elements, the first semiconductor layer of the one optical semiconductor element and a surface of the semiconductor laminated part of the other optical semiconductor element.

According to the above configuration, since adjacent optical semiconductor elements are electrically connected by wiring, a plurality of optical semiconductor elements of the optical semiconductor array are electrically connected. Since the wiring is connected to the first semiconductor layer through the connecting hole separated from the groove, the variation in the contact area between the wiring and the first semiconductor layer can be reduced. Therefore, it is possible to reduce the variation in the contact resistance of the wiring in the connecting holes of the plurality of optical semiconductor elements and reduce the variation in the output of the plurality of optical semiconductor elements.

Advantages of the Invention

According to the optical semiconductor array the effective area can be increased and the output can be improved.

Figure 1:
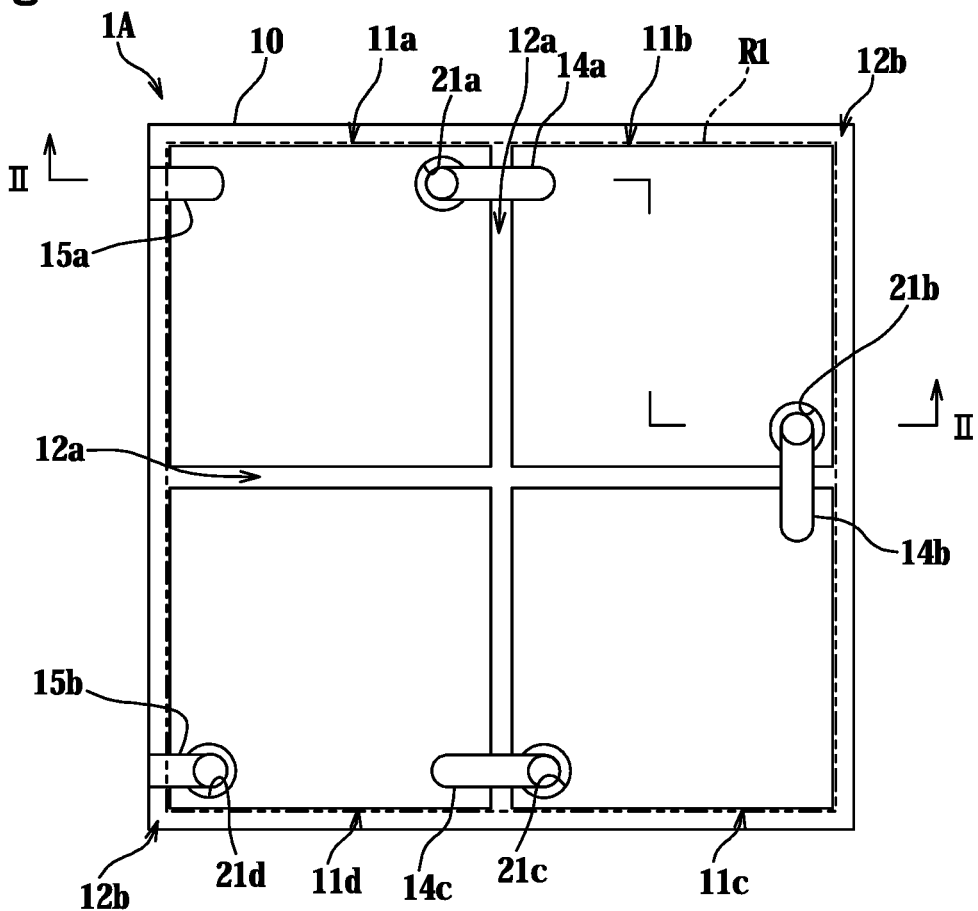
FIG. 1 is a plan view of an optical semiconductor array according to a first embodiment of the present invention.
Figure 3:
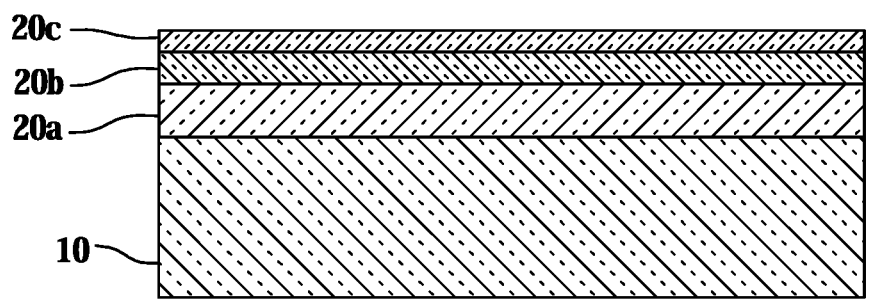
Figure 4:
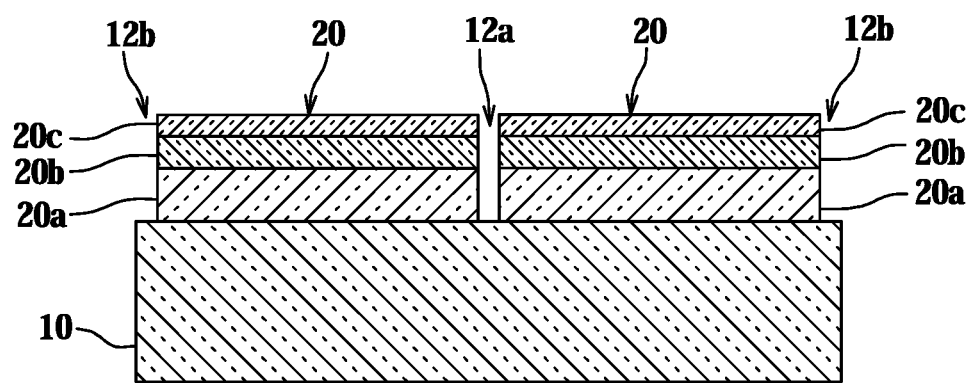
Figure 5:
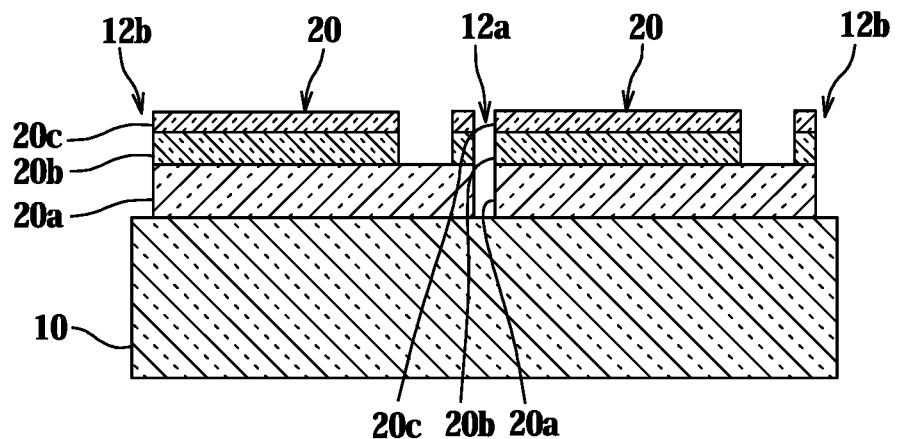
Figure 6:
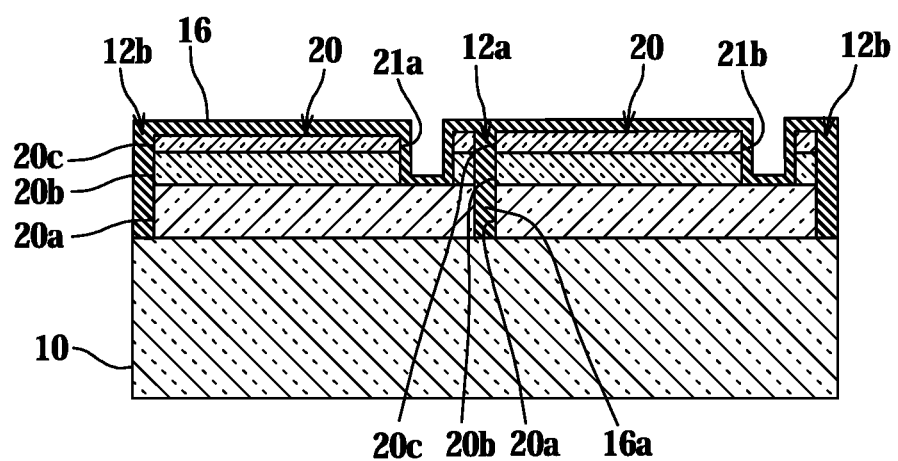
Figure 7:
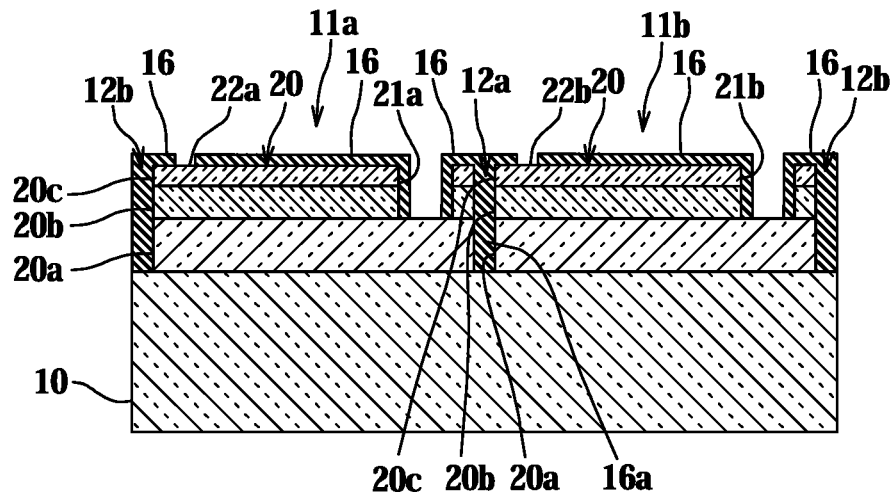
Figure 8:
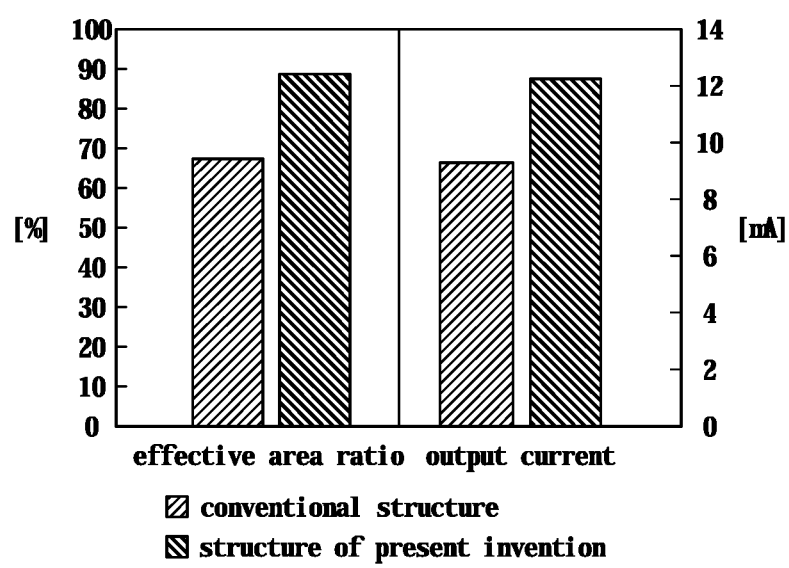
Figure 9:
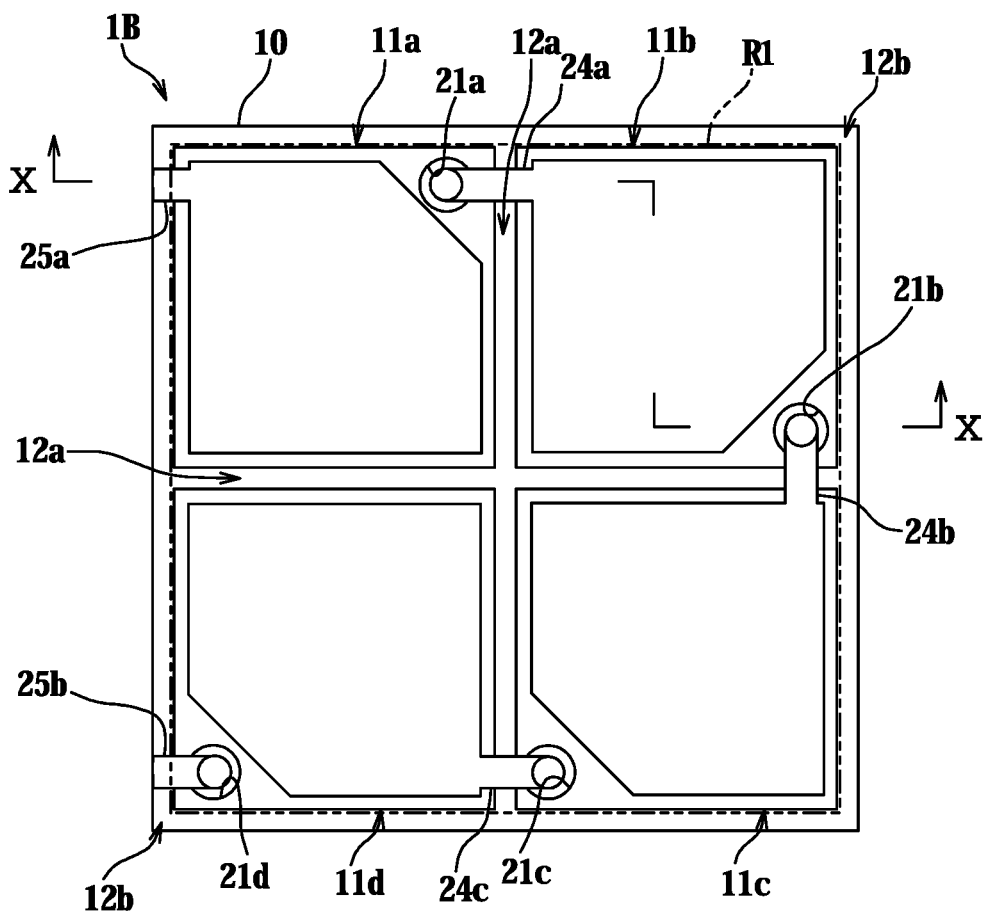
Figure 10:
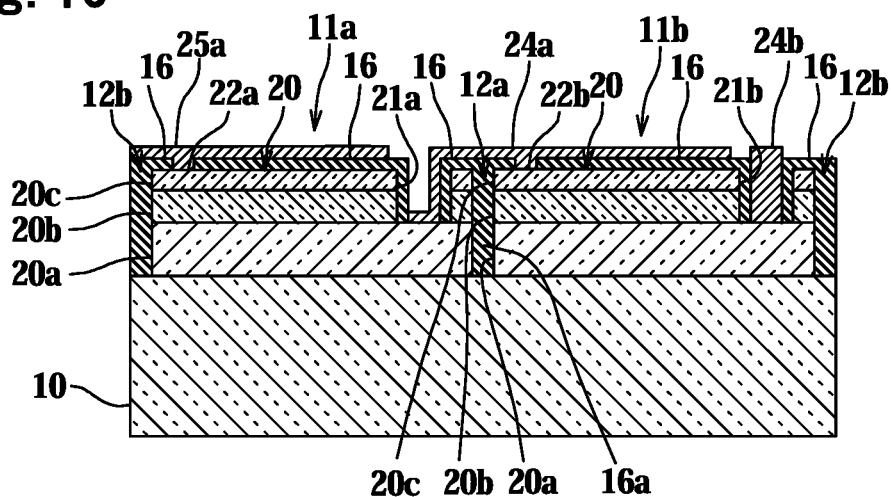

2 is a sectional view taken along line II-II of FIG. 1. FIG;

FIG. 3 is a cross-sectional view showing a semiconductor layer laminating step;

FIG. 4 is a cross-sectional view showing an element separation step;

FIG. 5 is a cross-sectional view showing a connecting hole forming step;

FIG. 6 is a cross-sectional view showing a protective film forming step;

FIG. 7 is a cross-sectional view showing a protective film removing step;

FIG. 8 is a graph showing a verification result of an effective area increasing effect;

FIG. 9 is a plan view of an optical semiconductor array according to a second embodiment of the present invention;

FIG. 10 is a cross-sectional view taken along line X-X in FIG. 9.

DESCRIPTION OF EMBODIMENTS

Hereinafter, embodiments for carrying out the present invention will be described based on examples.

First Embodiment

A surface incident type optical semiconductor array 1A having an optical semiconductor element (photodiode) that converts incident light into an electric current will be described.

Figure 2:
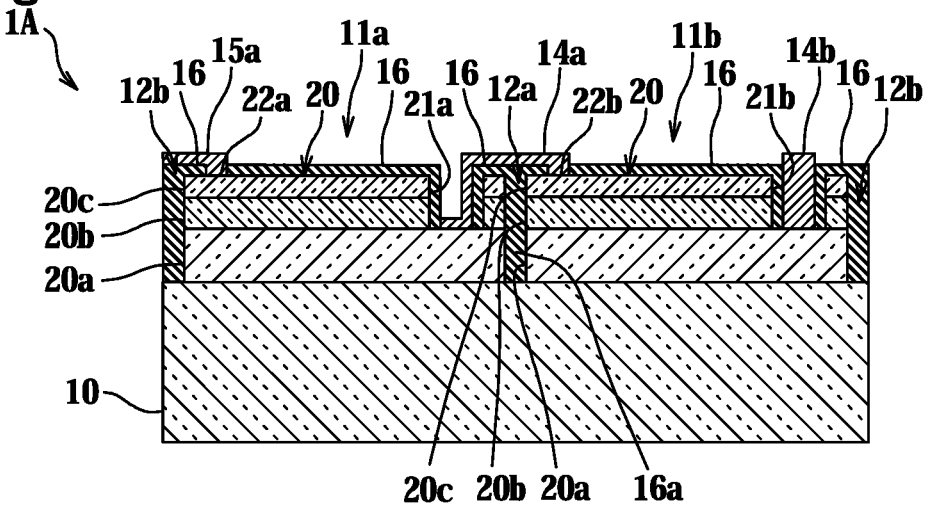

As shown in FIGS. 1 and 2, the optical semiconductor array 1A comprises, as a plurality of mesa-shaped optical semiconductor elements arranged in an array on the semiconductor substrate 10, for example, four optical semiconductor elements 11a to 11d having a rectangular shape in a plan view. Grooves 12a for separating the optical semiconductor elements 11a to 11d are formed between the optical semiconductor elements 11a to 11d. The optical semiconductor elements 11a to 11d are electrically connected in series by a plurality of wirings 14a to 14c, and wiring terminals 15a and 15b for external connection are formed on the optical semiconductor elements 11a and 11d at both ends, respectively.

The light receiving region R1 of the optical semiconductor array 1A is, for example, a square region having a side length of 100 μm. This region is divided by, for example, grooves 12a having a width of 2 μm, and is separated into four square optical semiconductor elements 11a to 11d having a side of 49 μm. The groove 12a is formed so as to reach the surface of the semiconductor substrate 10. Additionally, the groove 12a may be formed in a V-shaped cross section having a wider width toward the upper side, and the side surfaces of the optical semiconductor elements 11a to 11d may be inclined.

The width of the groove 12a can be appropriately set according to the process accuracy for forming the groove 12a, but it is preferable to reduce the width of the groove 12a in order to increase the effective area in the light receiving region R1. Further, the size and shape of the light receiving region R1 of the optical semiconductor array 1A and the quantity and shape of the optical semiconductor elements are not limited to the above, and are appropriately set according to the application of the optical semiconductor array 1A.

The surface of the optical semiconductor array 1A is covered with a protective film 16 having an insulating property. The protective film 16 is formed so as to fill the groove 12a and cover the surfaces of the optical semiconductor elements 11a to 11d, and protect the optical semiconductor elements 11a to 11d from moisture and the like. There is provided with an embedded protective film 16a embedded in a whole of the groove 12a so as to continue from the protective film 16. Along the outer edge of the light receiving region R1, a portion where the side surfaces of the optical semiconductor elements 11a to 11d and the surface of the semiconductor substrate 10 are covered with the protective film 16 is defined as a groove 12b. The groove 12b along the outer edge of the light receiving region R1 is for separating another optical semiconductor array formed adjacently on the same semiconductor substrate.

Each of the plurality of optical semiconductor elements 11a to 11d has a semiconductor laminated part 20 including a first semiconductor layer 20a in contact with the semiconductor substrate 10. The semiconductor laminated part 20 has a diode structure configured by stacking a in the order of, for example, an n+GaAs layer (first semiconductor layer 20a), an n-GaAs layer (second semiconductor layer 20b), and a p+AlGaAs layer (third semiconductor layer 20c) on semiconductor substrate 10 which is an i-GaAs substrate. It. The thicknesses of the n+GaAs layer, the n-GaAs layer, and the p+AlGaAs layer are appropriately set according to the application of the optical semiconductor array 1A.

The plurality of optical semiconductor elements 11a to 11d each have connecting holes 21a to 21d at portions separated from the grooves 12a and 12b in the semiconductor laminated part 20. The connecting holes 21a to 21d extend from the surface of each semiconductor laminated part 20 (the surface of the third semiconductor layer 20c) to the first semiconductor layer 20a by penetrating the third semiconductor layer 20c and the second semiconductor layer 20b.

The cylindrical inner walls of the connecting holes 21a to 21d are covered with a protective film 16. Corresponding wirings 14a to 14c and wiring terminals 15b are connected to the first semiconductor layer 20a which is not covered with the protective film 16 at the bottom of the connecting holes 21a to 21d.

The connecting holes 21a to 21d have a diameter of, for example, 5 µm, and are formed so that the portion closest to the grooves 12a and 12b is separated from the grooves 12a and 12b by a distance of, for example, 2 µm. This separation distance may be appropriately set according to the alignment accuracy so that the connecting holes 21a to 21d do not come into contact with the grooves 12a and 12b within the allowable range of the alignment deviation of the connecting holes 21a to 21d with respect to the grooves 12a and 12b. When the connecting holes 21a to 21d are formed so as to protrude into the grooves 12a and 12b, the area of the first semiconductor layers 20a to 20d at the bottom of the connecting holes 21a to 21d becomes small and the contact resistance of the wiring 14a becomes high. Therefore, such misalignment is not allowed.

The optical semiconductor array 1A has a plurality of wirings 14a to 14c for connecting a plurality of optical semiconductor elements 11a to 11d in series. For example, of the optical semiconductor elements 11a and 11b adjacent to each other via the groove 12a, the first semiconductor layer 20a of the one optical semiconductor element 11a and the wiring connection portion 22b on the surface of the semiconductor laminated part 20 (the surface of the third semiconductor layer 20c) of the other optical semiconductor element 11b are connected, through the connecting hole 21a of the one optical semiconductor elements 11a by the wiring 14a.

The surface of the semiconductor laminated part 20 is covered with a protective film 16 except for the wiring connection portion 22b. The wiring connection portion 22b has a diameter of, for example, 3 µm, and is formed so that the portion closest to the grooves 12a and 12b is separated from the grooves 12a and 12b to the same extent as the separation distance of the connecting hole 21a, for example.

Adjacent optical semiconductor elements 11b and 11c and adjacent optical semiconductor elements 11c and 11d are also connected in series by wirings 14b and 14c in the same manner as described above. In this way, the plurality of optical semiconductor elements 11a to 11d of the optical semiconductor array 1A are connected in series by the wirings 14a to 14c. The wiring terminal 15a is connected to the wiring connection portion 22a of the optical semiconductor element 11a, and the wiring terminal 15b is connected to the first semiconductor layer 20a via the connecting hole 21d of the optical semiconductor element 11d.

Next, the manufacturing method of the optical semiconductor array 1A will be described.

As shown in FIG. 3, the n+GaAs layer as the first semiconductor layer 20a, the n-GaAs layer as the second semiconductor layer 20b, and the p+AlGaAs layer as the third semiconductor layer 20c are laminated in this order on the semiconductor substrate 10 (semiconductor layer forming step).

Next, as shown in FIG. 4, by forming grooves 12a and 12b reaching the semiconductor substrate 10 in the semiconductor layers formed by stacking, the semiconductor layers are separated into the plurality of semiconductor laminated parts 20 (element separation step). For example, using a photoresist as an etching mask, a part of the semiconductor layers is dry-etched to form grooves 12a and 12b, and then the photoresist is removed.

Next, as shown in FIG. 5, connecting holes 21a, 21b and connecting holes 21c, 21d (not shown) that reach the first semiconductor layer 20a from the surface of the semiconductor laminated part 20 are formed in the separated semiconductor laminated part 20. (connecting hole forming step). For example, using a photoresist as an etching mask, the semiconductor layers (second and third semiconductor layers 20b and 20c) above the first semiconductor layer 20a are dry-etched to form connecting holes 21a to 21d at locations separated from the grooves 12a and 12b, and then the photoresist is removed.

At this time, within the permissible range of misalignment of the connecting holes 21a with respect to the semiconductor laminated part 20 (in the first and second axial directions orthogonal to each other in the plane parallel to the semiconductor substrate 10, for example, within ±1 µm), a separation distance (for example, 2 µm) that does not contact the grooves 12a and 12b is set.

Next, as shown in FIG. 6, the protective film 16 is deposited on the plurality of semiconductor laminated parts 20 and the semiconductor substrate 10 in which the grooves 12a and 12b and the connecting holes 21a etc. are formed (protective film deposition step). For example, as the protective film 16, a laminated film composed of an organic film such as polyimide or BCB and an inorganic film such as SiN film or SiO2 film is deposited. At this time, the groove 12a is filled with the organic film, or the side wall of the semiconductor laminated part 20 is covered with the organic film so that at least the upper portion of the groove 12a is closed by the organic film. Placing the protective film 16 as described above facilitates later wiring formation. It is not necessary to fill the groove 12a with the organic film, and the protective film 16 may be only an inorganic film.

The inorganic film of the protective film 16 is preferably a SiN film that functions as an antireflection film, and its thickness is preferably set to ¼ of the wavelength of the incident light. In the case of a GaAs optical semiconductor in the 800 nm wavelength band, for example, a SiN film having a thickness of 0.1 µm is suitable. The protective film 16 is also deposited on the connecting hole 21a and the like, and covers the side wall and the bottom of the connecting hole 21a.

Next, as shown in FIG. 7, the protective film 16 at the bottom of the connecting holes 21a, 21b and a part of the protective film 16 on the surface of the semiconductor laminated part 20 are removed (protective film removing step). For example, using a photoresist as an etching mask, dry etching is performed on the bottoms of the plurality of connecting holes 21a, 21b and the protective film 16 in a predetermined region on the surface of the plurality of semiconductor laminated parts 20.

By the protective film removing step, the first semiconductor layer 20a is exposed to a plurality of connecting holes 21a, 21b, etc., and a part of the surface of the semiconductor laminated part 20 (the surface of the third semiconductor layer 20c) is exposed to expose the wiring connection portion. 22a, 22b are formed respectively. If the alignment of the connecting hole 21a is within the allowable range of the etching mask, the protective film 16 at the bottom of the connecting hole 21a is removed, and the protective film 16 on the side wall remains.

Then, a wiring for connecting, through the connecting hole of one of the adjacent optical semiconductor element, the first semiconductor layer of the one optical semiconductor element and the surface of the semiconductor laminated part of the other optical semiconductor element is formed (wire formation step). Thus, the optical semiconductor array 1A of FIG. 2 is obtained. For example, a wiring material composed of an adhesion layer such as Ti or Cr and a metal layer such as Au is deposited, and a part of the wiring material is removed by dry etching using a photoresist as an etching mask, and wiring 14a to 14c and wiring terminals 15a, 15b are formed. If the alignment of the connecting hole 21a is within the allowable range of the etching mask, the wiring material at the bottom of the connecting hole 21a is not removed, and the wiring 14a etc. is connected to the first semiconductor layer 20a.

Wiring 14a to 14c and wiring terminals 15a and 15b may be formed by a known technique other than the above (for example, lift-off method), and wiring 14a to 14c and the terminals 15a and 15b may be formed by a wiring material other than the above (for example, Al, Pt, Ag, etc.).

Next, the optical semiconductor array 1A of the present invention and the optical semiconductor array having a conventional structure having a plurality of optical semiconductor elements formed by conventional mesa etching as in Patent Documents #1, #2 and #4 are provided with same condition as for the thickness of the semiconductor layer. The results of forming and comparing above described two optical semiconductor arrays will be described. It is assumed that the alignment deviation is allowed to be ±1 μm in the first and second axial directions orthogonal to each other in a plane parallel to the semiconductor substrate. Further, a square light receiving region R1 having a side of 100 μm is separated into four square photodiodes by grooves.

In the optical semiconductor array having the conventional structure, the second and third semiconductor layers above the first semiconductor layer of each optical semiconductor element are formed into a square having a side of 42 μm, and then the first semiconductor layer is formed into a square having a side of 46 μm. These sizes are taken into consideration when the size of the alignment deviation of the first semiconductor layer with respect to the second and third semiconductor layers and the alignment deviation of the wiring connection portion with respect to these layers are the maximum within the permissible range. The total area of the grooves between the optical semiconductor elements and the area shaded by the wirings was about 3300 μm2, and the ratio of the effective area to the light receiving region R1 (effective area ratio) was 67%.

On the other hand, in the optical semiconductor array 1A of the present invention, the first to third semiconductor layers 20a to 20c of each optical semiconductor element are formed into a square having a side of 49 μm. The total area of the grooves 12a between the optical semiconductor elements and the area shaded by the wirings 14a to 14c and the wiring terminals 15a and 15b were about 1200 μm2, and the effective area ratio was 88%.

As shown in FIG. 8, the effective area ratio of the optical semiconductor array having the conventional structure is 67%, the effective area ratio of the optical semiconductor array 1A having the structure of the present invention is 88%, and the effective area ratio of the optical semiconductor array 1A is increased. Further, when the entire light receiving region R1 is irradiated with 100 mW of light, the output current of the optical semiconductor array of the conventional structure is 9.2 mA and the output voltage is 3.5 V, whereas the output current of the optical semiconductor array 1A of the structure of the present invention is 12.1 mA and the output voltage is 3.5 V.

Therefore, the optical semiconductor array 1A has a large effective area by reducing the width of the grooves 12a without tightening the allowable range of misalignment. Further, as compared with the optical semiconductor array having the conventional structure, the output current is increased to the extent corresponding to the expansion of the effective area, and the output of the optical semiconductor element array 1A can be improved.

Second Embodiment

The back surface incident type optical semiconductor array 1B in which a part of the front surface incident type optical semiconductor array 1A of the first embodiment is modified will be described.

FIG. 9 and FIG. 10 show a back surface incident type optical semiconductor array 1B having a photodiode as a plurality of optical semiconductor elements 11a to 11d and incident light from the semiconductor substrate 10 side. The same parts as those in the first embodiment are designated by the same reference numerals as those in the first embodiment, and the description thereof will be omitted.

The wiring terminal 25a is formed so as to cover the connecting hole 21a of the semiconductor laminated part 20 and its periphery and the inner region excluding the outer edge portion of the semiconductor laminated part 20 on the protective film 16 on the surface of the semiconductor laminated part 20 of the optical semiconductor element 11a. A part of the wiring terminal 25a is connected to the wiring connection portion 22a on the surface of the semiconductor laminated part 20. The wiring terminal 25b is connected to the first semiconductor layer 20a of the optical semiconductor element 11d via the connecting hole 21d.

As for the wiring 24a that connects the first semiconductor layer 20a of the optical semiconductor element 11a and the wiring connection portion 22b of the optical semiconductor element 11b via the connecting hole 21a, a part of the wiring 24a is formed so as to cover the inner region of the optical semiconductor element 11b, similarly to the wiring terminal 25a. Similarly, the other wirings 24b and 24c also cover the inner regions of the optical semiconductor elements 11c and 11d, respectively, and connect the optical semiconductor element 11b and the optical semiconductor element 11c, and the optical semiconductor element 11c and the optical semiconductor element 11d, respectively.

The region covered with the wiring terminals 25a and the wirings 24a to 24c becomes a reflecting portion that reflects the light incident from the back surface of the semiconductor substrate 10 and transmitted through the semiconductor laminated part 20 on the semiconductor laminated part 20 again. Further, since among the region of the light receiving region R1, the area that does not contribute to photoelectric conversion is the grooves 12a and the connecting holes 21a to 21d, the effective area can be made larger than that of the surface incident type optical semiconductor array 1A of the first embodiment. Therefore, the light receiving sensitivity of each of the optical semiconductor elements 11a to 11d can be improved, and the output of the optical semiconductor array 1B can be improved.

In the method of manufacturing the back surface incident type optical semiconductor element array 1B, wirings 24a to 24c are wired so as to cover the inner regions of the plurality of semiconductor laminated parts 20 as shown in FIGS. 9 and 10. Since the other steps (semiconductor layer forming step, element separating step, connecting hole forming step, protective film deposition step, protective film removing step) are the same as those in the first embodiment, the description thereof will be omitted.

The actions and effects of the optical semiconductor arrays 1A and 1B will be described.

Since the optical semiconductor arrays 1A and 1B each have connecting holes 21a to 21d for connecting the plurality of optical semiconductor elements 11a to 11d to the first semiconductor layer 20a, they are not connected to the first semiconductor layer 20a via the grooves 12a. Therefore, the width of the groove 12a can be reduced, and the size of the semiconductor layer above the first semiconductor layer 20a of each of the optical semiconductor elements 11a to 11d can be made equal to that of the first semiconductor layer 20a. Therefore, the areas of the plurality of optical semiconductor elements 11a to 11d of the optical semiconductor elements arrays 1A and 1B can be increased, respectively, and the effective area of the optical semiconductor element arrays 1A and 1B can be increased.

Further, since the connecting holes 21a to 21d are separated from the grooves 12a and 12b, the areas of the connecting holes 21a to 21d are the same between the optical semiconductor elements 11a to 11d. Therefore, it is possible to reduce the variation in the area between the plurality of optical semiconductor elements 11a to 11d due to the connecting holes 21a to 21d, so that the output variation between the plurality of optical semiconductor elements 11a to 11d in the optical semiconductor arrays 1A and 1B can be reduced advantageously.

Then, since the adjacent optical semiconductor elements are electrically connected by the wirings 14a to 14c or the wirings 24a to 24c, the plurality of optical semiconductor elements 11a to 11d of the optical semiconductor arrays 1A and 1B are electrically connected. Since the wirings 14a to 14c and 24a to 24c are connected to the first semiconductor layer 20a via the connecting holes 21a to 21d separated from the grooves 12a and 12b, even if there is an alignment deviation within the allowable range of the connecting holes 21a to 21d, the variation in the contact area between the wirings 14a to 14c and 24a to 24c and the first semiconductor layer 20a can be reduced. Therefore, the variation in the contact resistance of the wirings 14a to 14c and 24a to 24c in the connecting holes 21a to 21d of the plurality of optical semiconductor elements 11a to 11d is reduced, and the variation in the output of the plurality of optical semiconductor elements 11a to 11d is reduced.

In the method for manufacturing the optical semiconductor arrays 1A and 1B, the semiconductor laminated parts 20 of the plurality of optical semiconductor elements 11a to 11d can be collectively formed by the element separation step. Therefore, the width of the grooves 12a can be reduced so that the size of the first semiconductor layer 20a of the semiconductor laminated part 20 and the size of the semiconductor layer above the first semiconductor layer 20a can be made equal. Then, the connecting holes 21a to 21d reaching the first semiconductor layer 20a can be formed by separating them from the grooves 12a and 12b by the connecting hole forming step. Therefore, the areas of the plurality of optical semiconductor elements 11a to 11d of the optical semiconductor elements arrays 1A and 1B can be increased, respectively, and the effective area of the optical semiconductor element arrays 1A and 1B can be increased.

Further, since the connecting holes 21a to 21d are formed so as to be separated from the grooves 12a and 12b, the areas of the connecting holes 21a to 21d are the same. Therefore, it is possible to reduce the variation in the area of the optical semiconductor elements 11a to 11d due to the connecting holes 21a to 21d among the plurality of optical semiconductor elements 11a to 11d, and it is advantageous for reducing the output variation between the plurality of optical semiconductor elements 11a to 11d of the optical semiconductor arrays 1A and 1B can be reduced.

Further, a part of the protective film 16 deposited by the protective film deposition step is removed by the protective film removing step, and a part of the surface of the first semiconductor layer 20a at the bottom of the connecting holes 21a to 21d and the semiconductor laminated part 20 are exposed. Then, by the wiring forming step, the first semiconductor layer 20a of the adjacent optical semiconductor elements among the plurality of optical semiconductor elements 11a to 11d and the surface of the semiconductor laminated part 20 are electrically connected by the wirings 14a to 14c or the wirings 24a to 24c.

Since the wirings 14a to 14c and 24a to 24c are connected to the first semiconductor layer 20a via the connecting holes 21a to 21d separated from the grooves 12a and 12b, even if there is an alignment deviation within the allowable range of the connecting holes 21a to 21d, the variation in the contact area between the wirings 14a to 14c and 24a to 24c and the first semiconductor layer 20a can be reduced. Therefore, the variation in the contact resistance of the wirings 14a to 14c and 24a to 24c in the connecting holes 21a to 21d of the plurality of optical semiconductor elements 11a to 11d is reduced, and the variation in the output of the plurality of optical semiconductor elements 11a to 11d can be reduced.

The examples of the optical semiconductor arrays 1A and 1B having a photodiode which is a light receiving element as the plurality of optical semiconductor elements 11a to 11d have been described above, but the configuration of the present invention can be applied to an optical semiconductor array having a light emitting element such as a light emitting diode. Further, it can be applied not only to an optical semiconductor array formed on an i-GaAs substrate, but also to an optical semiconductor array formed on, for example, a Si substrate, an InP substrate, a sapphire substrate, or the like.

In the above embodiment, the diode structure having the first to third semiconductor layers 20a to 20c as the semiconductor laminated part 20 has been described, but the semiconductor laminated part 20 may be composed of two or four or more semiconductor layers. Further, a plurality of optical semiconductor elements connected in series may be formed into one series group, and an optical semiconductor array may be formed so as to have a plurality of series groups or to connect a plurality of series groups in parallel. In addition, a person skilled in the art can carry out the embodiment in a form in which various modifications are added to the above embodiment without departing from the present invention, and the present invention also includes such modified forms.

DESCRIPTION OF REFERENCE NUMERALS 1A, 1B: optical semiconductor array
10: semiconductor substrate
11a-11d: optical semiconductor element
12a, 12b: groove
14a-14c: wiring
15a, 15b: wiring terminal
16: protective film
20: semiconductor laminated part
20a: first semiconductor layer
20b: second semiconductor layer
20c: third semiconductor layer
21a-21d: connecting hole 22a-22d: wiring connection
24a to 24c: wiring
25a, 25b: wiring terminal
R1: light receiving area

The invention claimed is:

1. An optical semiconductor array having a semiconductor substrate and a plurality of mesa-shaped optical semiconductor elements separated by grooves on the semiconductor substrate, wherein
 each of the plurality of optical semiconductor elements comprises a semiconductor laminated part including a first semiconductor layer in contact with the semiconductor substrate,
 a connecting hole formed at a portion separated from the groove in the semiconductor laminated part so as to extend from a surface of the semiconductor laminated part to the first semiconductor layer, and
 a protective film having an insulating property covering the surface of the semiconductor laminated part and a cylindrical inner wall of the connecting hole; wherein
 there are provided with an embedded protective film embedded in a whole of the groove so as to continue from the protective film, and a wiring for connecting, through the connecting hole of one of the adjacent optical semiconductor elements and a wiring connection portion formed through the protective film so as to expose a portion of the surface of the semiconductor laminated part of the other of the adjacent optical semiconductor elements, the first semiconductor layer of the one optical semiconductor element and a surface of the semiconductor laminated part of the other optical semiconductor element; wherein
 a portion of the wiring is formed on a surface of the embedded protective film at a position passing the groove.

* * * * *